United States Patent
Braun

(10) Patent No.: US 10,158,348 B1
(45) Date of Patent: Dec. 18, 2018

(54) TRI-STABLE STORAGE LOOPS

(71) Applicant: Alexander L. Braun, Baltimore, MD (US)

(72) Inventor: Alexander L. Braun, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/886,652

(22) Filed: Feb. 1, 2018

(51) Int. Cl.
| | |
|---|---|
| H01L 39/22 | (2006.01) |
| H01L 39/02 | (2006.01) |
| H03K 19/195 | (2006.01) |
| H03K 3/038 | (2006.01) |
| G11C 11/44 | (2006.01) |
| H01L 39/04 | (2006.01) |
| H01L 39/24 | (2006.01) |

(52) U.S. Cl.
CPC .............. *H03K 3/038* (2013.01); *G11C 11/44* (2013.01); *H01L 39/025* (2013.01); *H01L 39/045* (2013.01); *H01L 39/22* (2013.01); *H01L 39/223* (2013.01); *H01L 39/2493* (2013.01); *H03K 19/195* (2013.01)

(58) Field of Classification Search
CPC ... H01L 29/437; H01L 39/16; H01L 39/2403; H01L 29/882; H01L 39/025; H01L 39/045; H01L 39/22; H01L 39/223; H01L 39/2493; H01L 39/10; H01L 39/242; H03K 17/92; H03K 19/195; H03K 23/763; H03K 3/38; H03K 19/1954; G06F 7/381; G01R 33/0358; G01R 33/326; Y10S 505/846; Y10S 505/874; G11B 5/3126; G11C 11/44; G11C 19/32; G11C 15/06; G06N 99/002; B82Y 10/00; H04L 12/4633
See application file for complete search history.

(56) References Cited

U.S. PATENT DOCUMENTS

| | | |
|---|---|---|
| 3,094,685 A | 6/1963 | Crowe |
| 4,956,642 A | 9/1990 | Harada |

(Continued)

OTHER PUBLICATIONS

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

*Primary Examiner* — Vibol Tan
(74) *Attorney, Agent, or Firm* — Tarolli, Sundheim, Covell & Tummino LLP

(57) ABSTRACT

A tri-stable storage loop useful in reciprocal quantum logic (RQL) gate circuits and systems has control and signal input lines. When alternating stable current storage states are induced in the storage loop by an alternating input provided to the control input line, provision of a positive SFQ pulse on the signal input line while the storage loop stores a positive current changes the storage loop from alternating between a positive-current state and a null-current state to alternating between a negative-current state and the null-current state, and provision of a negative SFQ pulse on the signal input line while the storage loop stores a negative current changes the storage loop from alternating between the negative-current state and the null-current state to alternating between the positive-current state and the null-current state.

20 Claims, 2 Drawing Sheets

(56) References Cited

U.S. PATENT DOCUMENTS

| | | |
|---|---|---|
| 5,233,243 A | 8/1993 | Murphy et al. |
| 6,310,488 B1 | 10/2001 | Hasegawa et al. |
| 6,608,518 B2 * | 8/2003 | Furuta ............... B82Y 10/00 327/367 |
| 6,734,699 B1 | 5/2004 | Silver et al. |
| 6,756,925 B1 | 6/2004 | Leung et al. |
| 7,129,869 B2 | 10/2006 | Furuta et al. |
| 7,227,480 B2 * | 6/2007 | Furuta ............... H03K 3/38 341/126 |
| 7,724,020 B2 * | 5/2010 | Herr ............... B82Y 10/00 326/3 |
| 7,786,748 B1 | 8/2010 | Herr |
| 7,903,456 B2 | 3/2011 | Kirichenko et al. |
| 7,944,253 B1 | 5/2011 | Kirichenko |
| 7,969,178 B2 | 6/2011 | Przybysz et al. |
| 7,977,964 B2 * | 7/2011 | Herr ............... B82Y 10/00 326/4 |
| 8,138,784 B2 * | 3/2012 | Przybysz ............ G06N 99/002 326/4 |
| 8,489,163 B2 | 7/2013 | Herr et al. |
| 8,611,974 B2 * | 12/2013 | Maibaum ............... B82Y 10/00 327/367 |
| 9,455,707 B2 | 9/2016 | Herr et al. |
| 9,543,959 B1 | 1/2017 | Carmean et al. |
| 9,595,970 B1 | 3/2017 | Reohr et al. |
| 9,646,682 B1 | 5/2017 | Miller et al. |
| 9,712,172 B2 | 7/2017 | Shauck et al. |
| 9,780,765 B2 | 10/2017 | Naaman et al. |
| 9,812,192 B1 | 11/2017 | Burnett et al. |
| 9,876,505 B1 | 1/2018 | Dai et al. |
| 9,887,700 B2 | 2/2018 | Carmean et al. |
| 9,905,900 B2 | 2/2018 | Herr et al. |
| 9,917,580 B2 | 3/2018 | Naaman |
| 9,972,380 B2 | 5/2018 | Ambrose |
| 2003/0011398 A1 | 1/2003 | Herr |
| 2003/0016069 A1 | 1/2003 | Furuta et al. |
| 2009/0153180 A1 | 6/2009 | Herr |
| 2011/0133770 A1 | 6/2011 | Przybysz et al. |
| 2016/0164505 A1 | 6/2016 | Naaman et al. |
| 2017/0359072 A1 | 12/2017 | Hamilton et al. |

\* cited by examiner

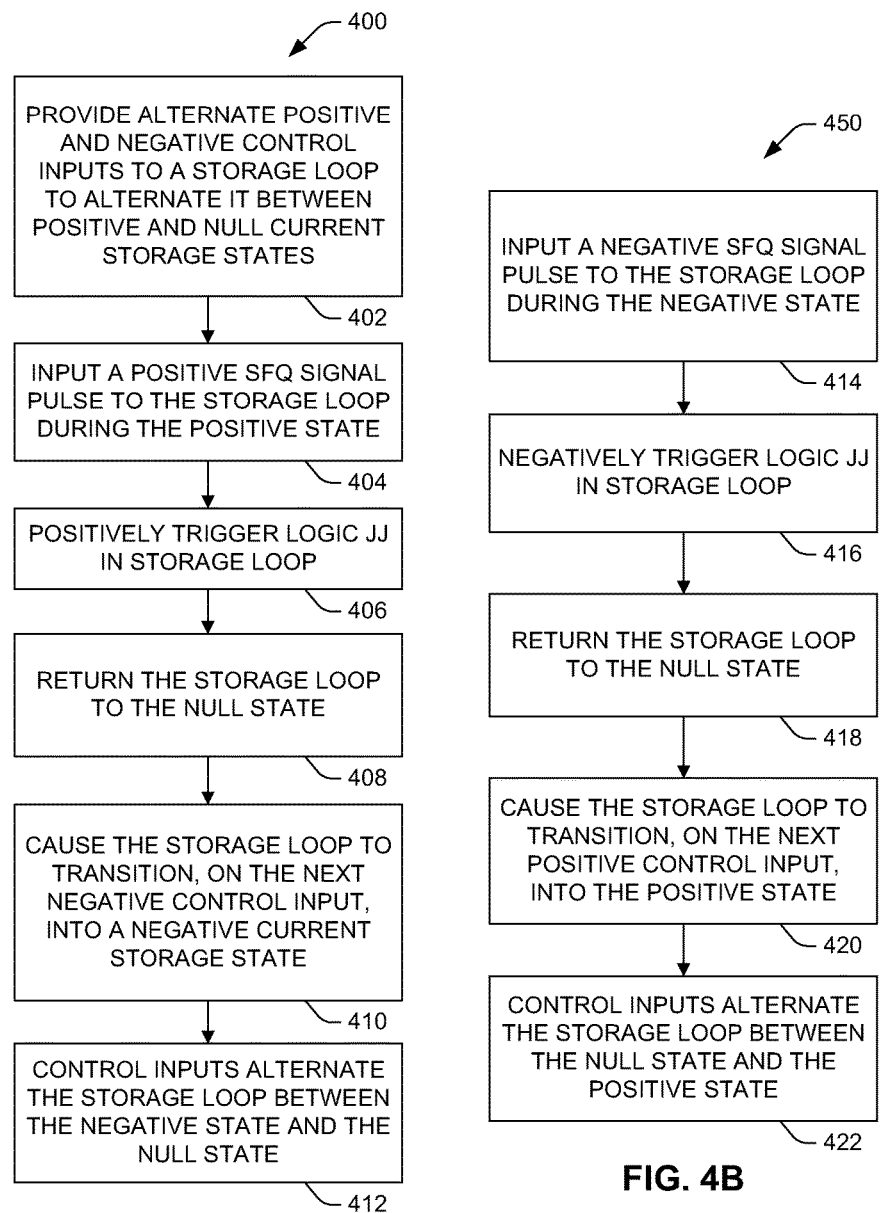

US 10,158,348 B1

TRI-STABLE STORAGE LOOPS

TECHNICAL FIELD

The present invention relates generally to quantum and classical digital superconducting circuits, and specifically to tri-stable storage loops for use in RQL circuits, that is, loops capable of stably holding currents representative of positive, negative, and zero states until a held state is affirmatively altered by one or more input signals.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

In the context of systems and circuits in the reciprocal quantum logic (RQL) family, a storage loop is a loop capable of holding a superconducting current representative of a state, stably, until the current in such loop, and thereby the represented state, is affirmatively altered by an input signal, as opposed to by, for example, ambient AC conditions present in a larger circuit of which the storage loop may be a constituent.

SUMMARY

One example includes a reciprocal quantum logic (RQL) tri-stable storage loop circuit. A control input line provides a control input to an input end of a storage loop in the circuit. A signal input line provides a signal input to an output end of the storage loop. An output line propagates an output single flux quantum (SFQ) pulse from the output end of the storage loop. The storage loop is made up of a control Josephson junction (JJ) at the input end, a logic JJ at the output end, and a storage inductor connecting the input end to the output end.

Another example includes a method of altering a series of pulses from alternating between a positive-current state and a null current state to alternating between a negative-current state and the null-current state. Alternate positive and negative control inputs are provided to a storage loop in an RQL system to alternate the storage loop between a positive current storage state in which current circulates in the loop in a positive direction and a null current storage state in which essentially no current circulates in the loop. A positive SFQ signal pulse is input to the storage loop during the positive state to return the storage loop to the null state and subsequently to cause the storage loop to transition, on the next negative control input, into a negative current storage state in which current circulates in the loop in a negative direction. Thereupon, the control inputs alternate the storage loop between the negative state and the null state.

Yet another example includes a circuit comprising a control input line connected to an input node, a control JJ connected between a circuit ground and the input node, a storage inductor connected between the input node and an output node, a logic JJ connected between the circuit ground and the output node, a signal input line connected to the output node; and an output line connected to the output node. The control JJ, storage inductor, and logic JJ form a storage loop. The control JJ and storage inductor are sized to provide unidirectional flow of control inputs provided via the control input line.

BRIEF DESCRIPTION OF THE DRAWINGS

FIGS. 4A and 4B are flow diagrams of example methods of altering a series of pulses from alternating between a positive-current state and a null-current state to alternating between a negative-current state and the null-current state (FIG. 4A), and vice-versa (FIG. 4B).

DETAILED DESCRIPTION

This disclosure relates generally to logical circuits for use in reciprocal quantum logic (RQL) systems and related methods. This disclosure more specifically relates to an inductive storage loop that can be driven into any of three stable states via the interaction of signals at Josephson junctions (JJs) at both ends of the loop. The inductive storage loop described herein enables single flux quantum (SFQ) logic to selectively apply positive, negative, or no bias at one of the junctions.

Figure 1:
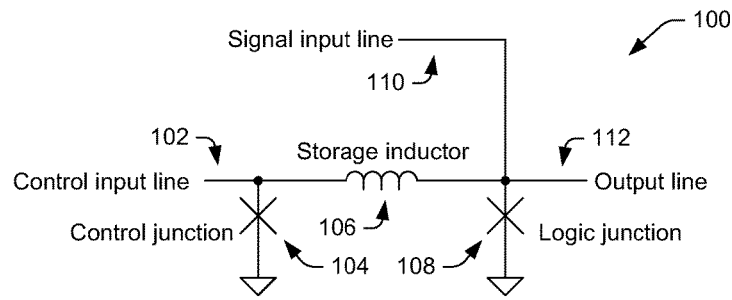
FIG. 1 is a circuit diagram of an example tri-stable loop.

FIG. 1 shows an example tri-stable loop 100. Tri-stable loop 100 includes control input line 102 provided to an input node connecting control JJ 104 to storage inductor 106. At the opposite end of storage inductor 106 is an output node to which logic JJ 108, signal input line 110, and output line 112 are connected. Thus, storage loop 100 is formed between a circuit ground, control JJ 104, storage inductor 106, logic JJ 108, and the circuit ground. Input lines 102, 110 and output line 112 can be connected to, for example, Josephson transmission lines (JTLs) (not shown) to propagate SFQ pulses into or out of storage loop 100, respectively.

Loop 100 applies additional bias to logic JJ 108, such that an SFQ signal applied along a signal input line 110 produces an output that is propagated on output line 112. To accomplish this, control junction 104 is triggered to put an SFQ of current into storage loop 100. This may be done via RQL-encoded SFQ pulses supplied along control input line 102, or direct application of AC power supplied along control input line 102.

The selections of component sizes in storage loop 100 provide a unidirectional data flow. For example, control JJ 104 can be sized large relative to logic JJ 108 and storage inductor 106 can be sized large relative to propagation-path inductances in input line JTLs (not shown) to make loop 100 stable regardless of surrounding AC bias conditions. Signal direction is thereby enforced in circuit 100. As an example, an SFQ pulse provided on control input line 102 can place one $\Phi_0$ of current into storage loop 100. The magnitude of current through such a storage loop is determined by the size of storage inductor 106 in storage loop 100. Thus, the inductance value of an input inductor (not shown) on control input line 102 can be small (e.g., between about 8 pH and 9 pH, e.g., 8.5 pH) in comparison to the inductance value of storage inductor 106. On the other hand, storage inductor 106 can sized to be relatively large (e.g., between about 30 pH and 40 pH, e.g., 35 pH) (e.g., about four times larger than the aforementioned input inductor) to reduce the magnitude of the stored current induced by a control input SFQ pulse provided on control input line 102. In some examples, the magnitude of a current introduced at control input line 102 is about four times larger than the current stored in storage loop 100. Control JJ 104 is sized such that any driving JTL (not shown) connected to the control input line 102 is capable of flipping control JJ 104 to put current into storage loop 100, but the current in the storage loop 100 is never sufficient to unflip control JJ 104 and allow the stored pulse to back out of control input line 102.

Figure 2:
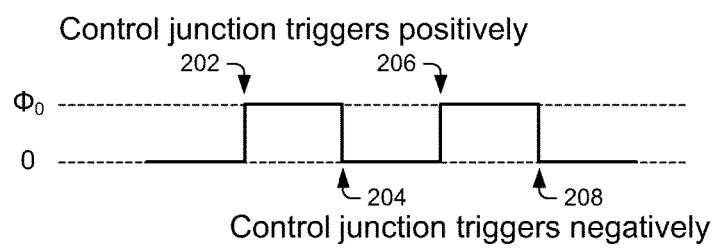
FIG. 2 is a plot of current in a hi-stable loop as a function of time with cyclical control inputs but absent signal inputs.

In RQL circuits, any Josephson junction, the superconducting phase of which is representative of a logical state, triggers in an alternating fashion: positive, negative, positive, negative, etc. FIG. 2 shows, as a function of time, the current in storage inductor 106 as control junction 104 is triggered in this alternating fashion by currents provided along control input line 102 with no signal inputs applied along signal input line 110. Each positive triggering 202, 206 of control junction 104 puts one $\Phi_0$ (about 2.07 mA-pH) worth of current into storage loop 100, positively biasing logic junction 108. Each negative triggering 204, 208 removes this biasing current (i.e., setting it back to zero). In some examples, the signal to control input line 102 can be configured to cause one triggering pair (e.g., 202, 204) every AC clock cycle. In other examples, the applied current provided to control input line 102 could be present across multiple AC clock cycles.

Figure 3:
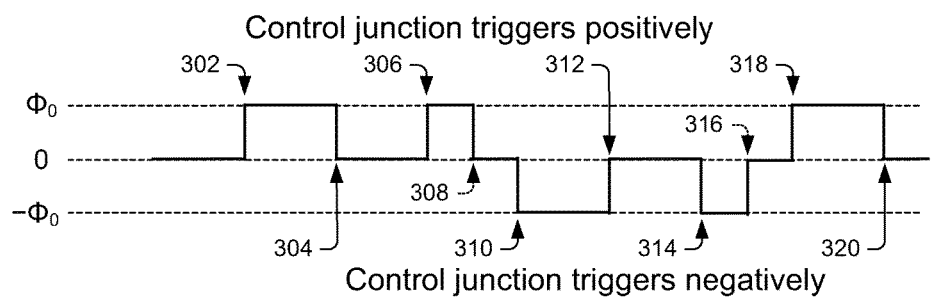
FIG. 3 is a plot of current in a hi-stable loop as a function of time with cyclical control inputs and with signal inputs.

FIG. 3 shows a plot similar to that of FIG. 2 but with the addition of the effect of signal inputs applied on signal input line 110. As the result of control signals provided along control input line 102, control junction 104 still alternately triggers positively 302, 306, 312, 318 and negatively 304, 310, 314, 320. Any SFQ pulses input to circuit 100 via signal input line 110 during times when there is zero current in loop 100 are insufficient to trigger logic junction 108 on their own. However, such SFQ pulses are capable of triggering logic junction 108 with the additional bias provided by current in storage inductor 106.

Initially, control junction 104 is only capable of applying positive bias or no bias to logic junction 108, because, as shown in FIG. 2, in absence of signal input, the current in loop 100 only varies between 0 and one $\Phi_0$ worth of current. However, the positive triggering of logic junction 108 annihilates the current stored in storage loop 100 and removes this positive bias, as shown at point 308. After this point 308, the next triggering 310 of control junction 104 is negative and control junction 104 is now only capable of applying negative bias.

Subsequent triggerings 310, 312, 314 of control junction 104 switch the applied bias between zero and $-\Phi_0$ until logic junction 108 is triggered negatively 316 by the combination of this bias and an applied negative SFQ pulse at signal input line 110. This again annihilates the current in storage loop 100, which then returns to the original state wherein control junction 104 once again can apply only positive bias or no bias.

In view of the above description, tri-stable storage loops of the type illustrated in FIG. 1 provide the ability to interrupt an alternating series of pulses coming from one RQL signal such that it can selectively alternate not just between a positive-current state and a no-current state, but can also reach a negative-current state as well. Although in the above-described examples of FIGS. 2 and 3 a first triggering (e.g., 202 or 302) of control junction 104 is assumed to be in the positive direction, circuit 100 functions equivalently when the first triggering of controller junction 104 is negative, with the signs of all described currents being reversed. Construction of gates providing some logic functions benefit in part count, efficiency, etc. from the ability of an RQL signal to apply positive, negative, or no bias current to a decision-making Josephson junction. Tri-stable loops of the type described herein accordingly provide the benefit over earlier designs in construction of such RQL gates. As examples, storage loop 100 can be used to create component-efficient D flip-flops, majority gates, AND gates, OR gates, AND-OR gates, NAND gates, and NOR gates, among others, compatible with RQL systems. In some examples, multiple storage loops can be combined such that the storage loops share a common logic junction that is triggered only upon appropriate biasing created by current stored in a plurality of, a majority of, or certain of the storage loops.

FIG. 4A shows method 400 of altering a series of pulses from alternating between a positive-current state and a null-current state to alternating between a negative-current state and the null-current state. Alternate positive and negative control inputs are provided 402 to a storage loop in a reciprocal quantum logic (RQL) system to alternate the storage loop between a positive current storage state in which current circulates in the loop in a positive direction and a null current storage state in which essentially no current circulates in the loop. A positive single flux quantum (SFQ) signal pulse is input 404 to the storage loop during the positive state. A logic JJ in the storage loop triggers 406 in the positive direction, annihilating the current in the storage loop and returning 408 the storage loop to the null state. On the next negative control input, the storage loop is caused 410 to transition into a negative current storage state in which current circulates in the loop in a negative direction, whereupon subsequent control inputs alternate 412 the storage loop between the negative state and the null state.

FIG. 4B shows method 450 of altering a series of pulses from alternating between a negative-current state and a null-current state to alternating between a positive-current state and the null-current state, which can continue from method 400 shown in FIG. 4A. A negative SFQ signal pulse is input 414 to the storage loop during the negative state. The logic JJ in the storage loop negatively triggers 416 to annihilate the current in the storage loop and thereby return 418 the storage loop to the null state. On the next positive control input, the storage loop is caused 420 to transition into the positive state, whereupon subsequent control inputs alternate 422 the storage loop between the null state and the positive state.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) tri-stable storage loop circuit comprising:
 a control input line configured to provide a control input to an input end of a storage loop;
 a signal input line configured to provide a signal input to an output end of the storage loop; and
 an output line configured to propagate an output single flux quantum (SFQ) pulse from the output end of the storage loop;
 wherein the storage loop comprises:
  a control Josephson junction (JJ) at the input end;
  a logic JJ at the output end; and
  a storage inductor connecting the input end to the output end, and
 wherein the circuit is configured such that, in the absence of input on the signal input line, the storage loop has two stable states including a first stable state wherein essentially no current flows in the storage loop and a second stable state wherein one $\Phi_0$ worth of current flows in the storage loop, and further wherein the circuit is configured such that, upon provision of a positive SFQ pulse to the signal input line, the storage loop obtains a third stable state wherein $-\Phi_0$ worth of current flows in the storage loop.

2. The circuit of claim 1, wherein the storage loop is configured to selectively apply any of positive, negative, or no bias to the logic JJ based on the storage loop storing positive current, negative current, or no current, respectively.

3. The circuit of claim 1, wherein the JJs and the storage inductor are sized to enforce unidirectional signal flow from the input end to the output end.

4. The circuit of claim 3, wherein the control JJ is sized such that:
 a driving JTL connected to the control input line is capable of causing the control JJ to trigger to put a current into the storage loop, and
 the current is insufficient to cause the control JJ to untrigger to cause a pulse to back out of the control input line.

5. The circuit of claim 1 configured such that an SFQ pulse input via the signal input line when there is zero current in the storage loop is insufficient to trigger the logic JJ.

6. The circuit of claim 5 configured such that a positive SFQ pulse input via the signal input line when there is positive current in the storage loop causes the JJ to positively trigger, annihilating the positive current in the storage loop.

7. The circuit of claim 6 configured such that a negative SFQ pulse input via the signal input line when there is negative current in the storage loop causes the JJ to negatively trigger, annihilating the negative current in the storage loop.

8. The circuit of claim 1, wherein, in the absence of input on the signal input line, the storage loop has two stable states.

9. A method of altering a series of pulses from alternating between a positive-current state and a null-current state to alternating between a negative-current state and the null-current state, the method comprising:
 providing alternate positive and negative control inputs to a storage loop in a reciprocal quantum logic (RQL) system to alternate the storage loop between
  a positive current storage state in which current circulates in the loop in a positive direction and
  a null current storage state in which essentially no current circulates in the loop; and
 inputting a positive single flux quantum (SFQ) signal pulse to the storage loop during the positive state to
  return the storage loop to the null state and subsequently to
  cause the storage loop to transition, on the next negative control input, into a negative current storage state in which current circulates in the loop in a negative direction, whereupon the control inputs alternate the storage loop between the negative state and the null state.

10. The method of claim 9, further comprising:
 inputting a negative SFQ signal pulse to the storage loop during the negative state to
  return the storage loop to the null state and subsequently to
  cause the storage loop to transition, on the next positive control input, into the positive state.

11. The method of claim 9, wherein the SFQ signal pulse is input to the storage loop at an end of the storage loop opposite from where the control input is provided to the storage loop.

12. The method of claim 9, wherein the storage loop comprises a control Josephson junction (JJ) and a logic JJ connected to opposite ends of a storage inductor.

13. The method of claim 12, wherein the inputted SFQ signal pulse causes the logic JJ to trigger and thereby to propagate an output pulse from the storage loop.

14. A circuit comprising:
 a control input line connected to an input node;
 a control Josephson junction (JJ) connected between a circuit ground and the input node;
 a storage inductor connected between the input node and an output node;
 a logic JJ connected between the circuit ground and the output node, the control JJ, storage inductor, and logic JJ forming a storage loop;
 a signal input line connected to the output node; and
 an output line connected to the output node;
 wherein the control JJ and storage inductor are sized to provide unidirectional flow of control inputs provided via the control input line;
 wherein the circuit is configured such that, in the absence of input on the signal input line, the storage loop has two stable states including a first stable state wherein essentially no current flows in the storage loop and a second stable state wherein one $\Phi_0$ worth of current flows in the storage loop, and
 wherein the circuit is configured such that, upon provision of a positive SFQ pulse to the signal input line, the storage loop obtains a third stable state wherein $-\Phi_0$ worth of current flows in the storage loop.

15. The circuit of claim 14, wherein the storage loop is configured to selectively apply any of positive, negative, or no bias to the logic JJ based on the storage loop storing positive current, negative current, or no current, respectively.

16. The circuit of claim 14, configured such that, when alternating stable states are induced in the storage loop by an alternating input provided to the control input line,
 provision of a positive SFQ pulse on the signal input line while the storage loop stores a positive current changes the storage loop from alternating between a positive-current state and a null-current state to alternating between a negative-current state and the null-current state, and provision of a negative SFQ pulse on the signal input line while the storage loop stores a negative current changes the storage loop from alternating between the negative-current state and the null-current state to alternating between the positive-current state and the null-current state.

17. The circuit of claim 14, wherein the JJs and the storage inductor are sized to enforce unidirectional signal flow from the input end to the output end.

18. The circuit of claim 17, wherein the control JJ is sized such that:
   a driving JTL connected to the control input line is capable of causing the control JJ to trigger to put a current into the storage loop, and
   the current is insufficient to cause the control JJ to untrigger to cause a pulse to back out of the control input line.

19. The circuit of claim 1, further comprising an AC power source configured to provide direct application of AC power supplied along the control input line.

20. The circuit of claim 1, further comprising circuitry configured to provide one reciprocal pair of SFQ pulses every AC clock cycle.

* * * * *